Figure 1:
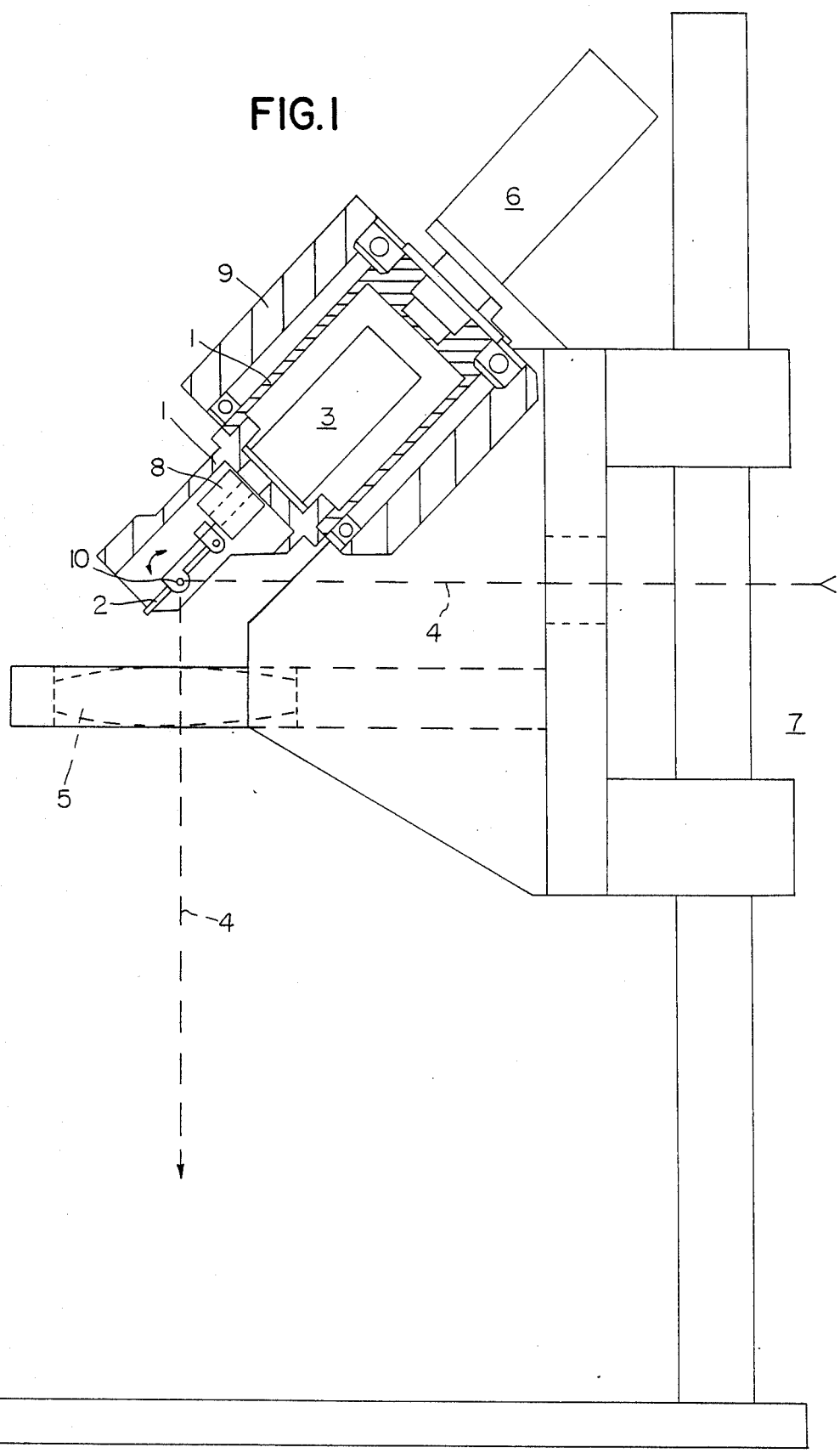

United States Patent [19]

Herrmann

[11] Patent Number: 4,926,194
[45] Date of Patent: May 15, 1990

[54] DEVICE FOR CONTROLLED DEFLECTION OF A LIGHT BEAM

[76] Inventor: Jakob Herrmann, Schillerstrasse 26, 8060 Dachau, Fed. Rep. of Germany

[21] Appl. No.: 262,356

[22] Filed: Oct. 25, 1988

[51] Int. Cl.$^5$ .................. G01D 15/14; G02B 26/08
[52] U.S. Cl. ..................... 346/108; 350/6.5; 350/6.6
[58] Field of Search ............ 346/107 R, 108, 160; 350/6.5, 6.6, 6.9, 6.91

[56] References Cited

U.S. PATENT DOCUMENTS

| | | | |
|---|---|---|---|
| 4,285,566 | 8/1981 | Yamamoto | 350/6.6 |
| 4,764,002 | 8/1988 | Wilson | 350/6.6 |
| 4,832,425 | 5/1989 | Walther et al. | 350/6.5 |

Primary Examiner—Bruce A. Reynolds
Assistant Examiner—Mark Reinhart
Attorney, Agent, or Firm—Steele, Gould & Fried

[57] ABSTRACT

Device for controlled deflection of a light beam emanating from a fixed light source, e.g. a laser beam, namely in two dimensions, by means of an adjustable deflection mirror journalled in a holding head, particularly intended for guiding a pulsed light beam along a mandering path for the purpose of marking specific points on small components (chips) or similar, characterized in that the holding head (1) for the deflection mirror (2) is journalled in itself and that a drive (3) is provided in the holding head (1) for turning the mirror (2) vertically to the rotation axis of the holding head (1).

2 Claims, 3 Drawing Sheets

DEVICE FOR CONTROLLED DEFLECTION OF A LIGHT BEAM

The invention refers to a device for controlled two-dimensional deflection of a light beam emanating from a fixed light source, e.g. a laser beam. Such devices are needed for marking defined points on planes resp. parts or object in one plane. In particular, the device according to the invention is intended for use in conjunction with marking systems for labeling small electrical components (chips) in the form of characters in a needle-print type code.

It is known how to two-dimensionally deflect a light beam coming from a fixed light source, namely by means of one or two mirrors, whereby the mirror itself is journalled in two axes perpendicular to one another and is adjusted by means of a central device so that thereby that location on the reproduction plane is identified and located which is to be marked. Thereby, the light beam itself may be deflected as being continuously alight, or the sensing may be made in darkness during the deflection process. When the marking location has been reached, a bright-up impulse is transmitted to the light beam and the location is correspondingly marked. This is of special importance, particularly for laser printers which reproduce the individual symbols of a needle print in a 5×7 code or similar. For sequential marking of a great number of points, the mirror must be adjusted very rapidly in the two dimensions, which requires significant acceleration and braking forces and places severe requirements on the installation.

The purpose of the invention is to indicate a device for deflection of a light beam intended for marking, thus preferably of a laser beam, by which a great number of marking points can be reached, whereby a drive system for adjusting the mirror in two dimensions is to be provided, which is simple and can be built to small size.

The abovementioned problem is solved by means of a device with the characteristics of patent claim 1.

In the device according to the invention, the deflection mirror is thus accommodated in a holding head which is, in turn, journalled in itself. In the holding head, the mirror is journalled around an axis standing vertical to the rotation axis of the holding head.

According to a particularly advantageous design, the turning of the mirror in the holding head proper is continuous and generated by a drive motor which, via an excenter drive, moves the mirror from one end position to the other and back (tilting). After each complete tilting movement of the mirror in the holding head, the holding head is moved one step further around its longitudinal axis, and the tilting movement of the mirror in the holding head continues. On the marking level, on which e.g. a great number of components etc. are accommodated, this causes a meandering movement of the light point, whereby the light point generated by the beam in the bright-up phase is first guided on a straight line depending on the tilting movement of the mirror in the holding head; then it is subjected to a predetermined dislocation in a direction vertical to this line by the turning of the holding head, and then moved back in a line parallel to the first line, etc.

If, during such a movement sequence of the beam, the sensing is undertaken with the beam light and dark, then precisely defined points can be illuminated and, if a laser beam is used, they can also be durably marked. By guiding the beam in the five or seven meander loops, it is possible to reproduce a great number of symbols in a 5×7 dot code by means of light sensing. All that is needed is a coordination between light and dark sensing of the beam to be deflected and the movement of the deflection mirror or its holding head.

Figure 2:
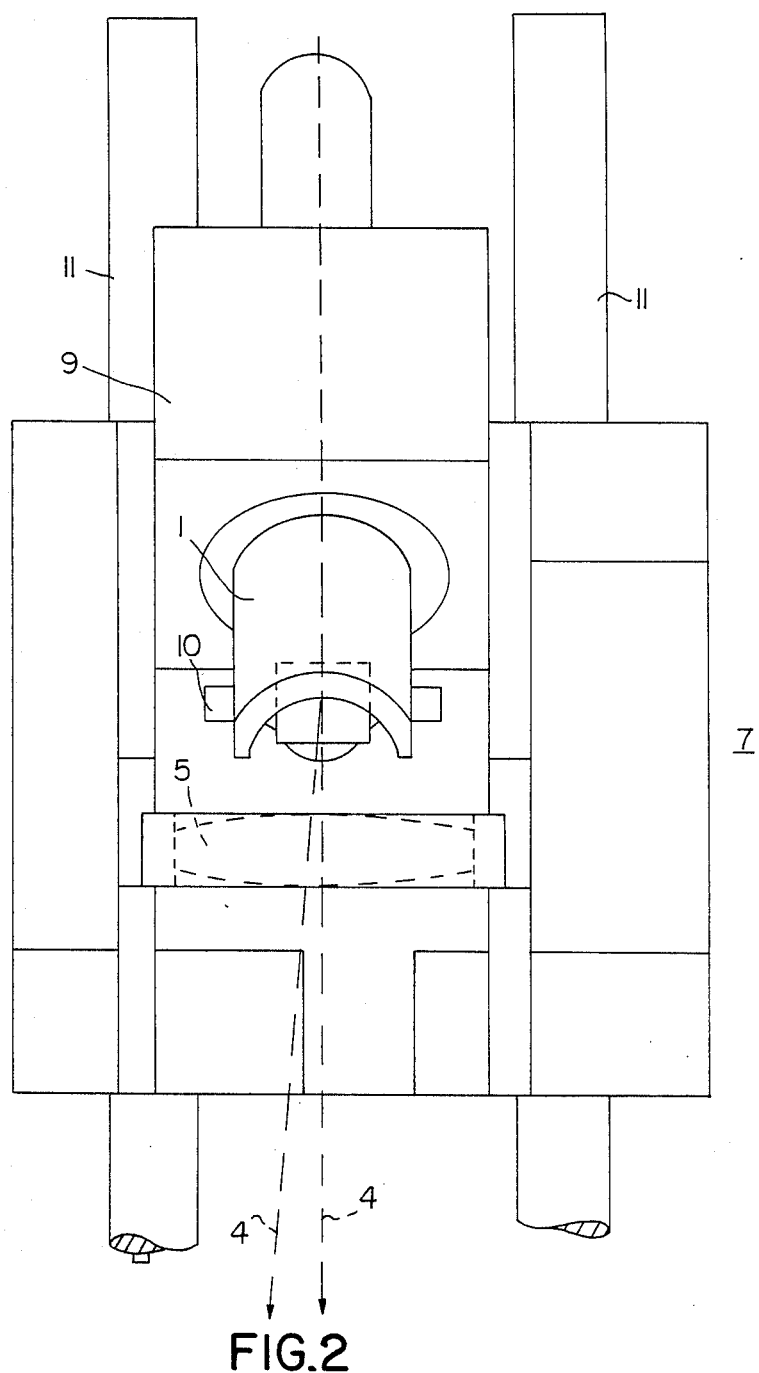
Figure 3:
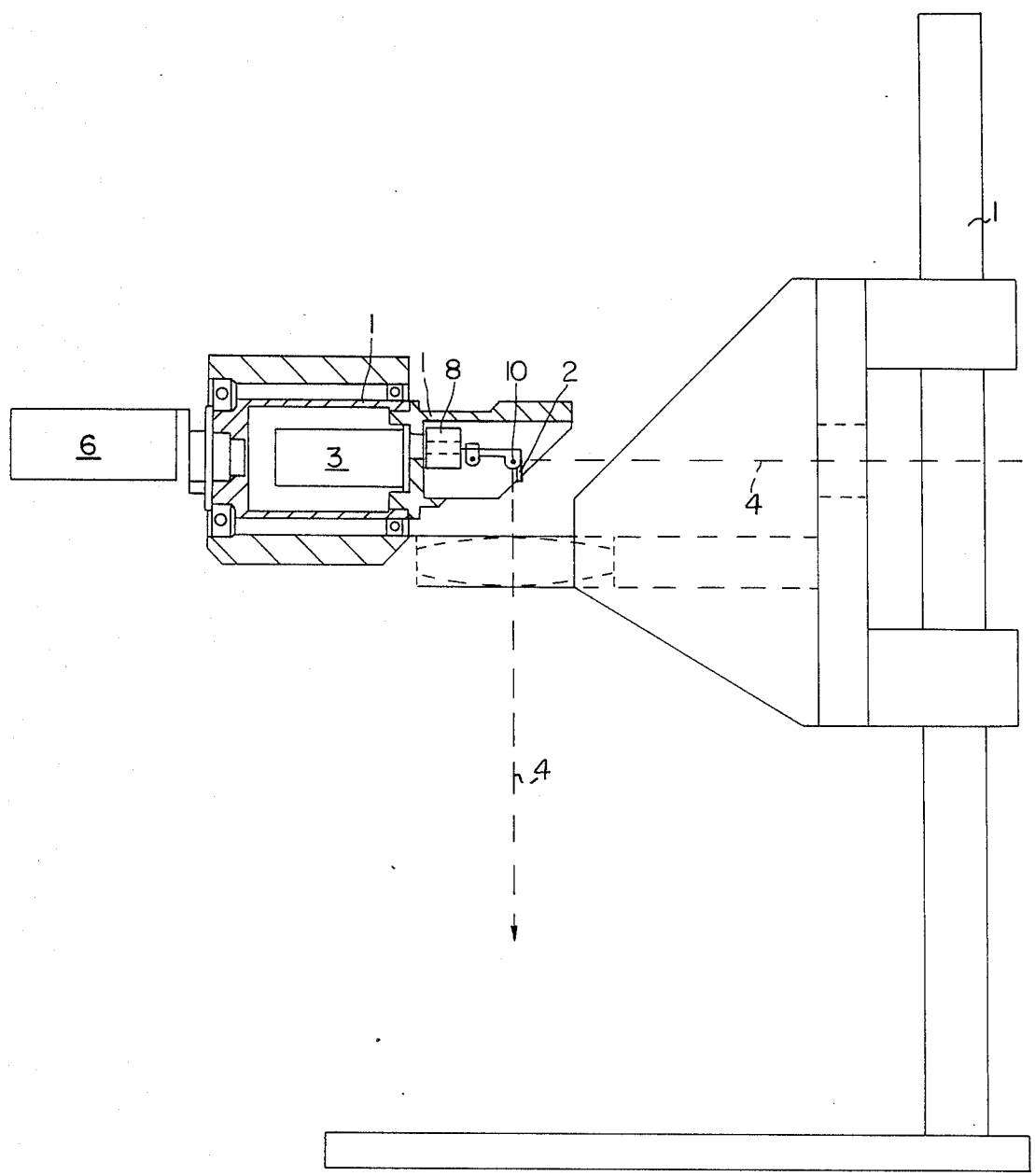

Aspects of the device according to the invention are explained in greater detail in the following, with reference to a design structure. The drawing shows:

FIG. 1 a partial section in side view of a device according to the invention,

FIG. 2 a partial front view of the device according to FIG. 1, in a partial section, and FIG. 3 a side view of a modified execution.

FIG. 1 shows a side view with a partial section of the holding head according to the invention, and FIG. 2 shows a top view of the device.

In the figures, 7 is the common identification of a stand with two guide rods 11, which stand carris a movable deflection head with a deflection mirror 2 in combination with a lens 5.

The deflection head with its mirror 2 is intended to deflect downwards, in a controllable manner, a light beam 4 generated by a light source, e.g. a laser—not shown—whereby this light beam can be continuously activated or preferably cycled according to deflection.

The mirror 2 is self-contained inside a two-part sleeve 1, i.e. journalled around an axis vertical to the light beam whereby, as can be seen in FIG. 1, the mirror 2 is continuously turned in the direction of the indicated arrow by means of a drive 3 and an eccentric 8. Thereby, the light beam is moved from left to right and back on the symbol level and is thereby moved back and forth over a object placed below or above it, e.g. a row of ICs to be marked, a text line, etc.

The entire sleeve 1, in which the mirror and the drive motor 3 are mounted, can be rotated by increments inside a housing. When moved by one increment, the beam is correspondingly displaced laterally, i.e. out of or into the symbol level as shown in FIG. 1, and according to the representation in FIG. 2 moved a predetermined increment laterally, whereafter it returns according to the pre-set increment, whereby the next points in a row of the points to be individually marked can be sensed by light and dark, e.g. in order to represent symbols in a 5×7 code.

Thereby, the expert can see that subsequent points in a series of lines, e.g. 5 or 7, can be marked without difficulties in this manner.

Depending on the drive motor 3, the mirror 2 always moves via an eccentric drive 8 between two end positions, e.g. against a spring force, and each time it reaches the end positions the spatial position of the mirror 2 is moved by one increment by means of the drive motor 6, so that, in its return travel, the beam 4 is laterally displaced and parallel to its previous direction.

The mirror 2 is itself journalled around an axis 10.

FIG. 3 shows a modified execution, in which the holding device for the mirror can be turned in increments in an axis flush with the light beam 4. Identical steps of the drive are assigned to approximately equal deflections. Otherwise, the function is identical to that according to FIGS. 1 and 2, i.e the mirror 2 is turned around the axis 10 by means of the motor 3 via an eccentric drive 8, e.g. against the force of a spring, whereby the light beam 4 is moved on the symbol level on the object or objects to be marked. With the aid of the drive motor 6, the light beam is moved forward or backward when the end position of the mirror has been reached, and then returned in parallel with the first movement line by the continuous movement of the mirror.

The invention was explained with reference to a simplified, concrete execution. It is important for the implementation of the inventive thought that a continuously journalled mirror is provided inside a deflection head, which is continuously moved by a drive from one end position to another and is turned in itself together with its drive, whereby the tilting movement of the mirror is continued in the reverse direction.

A number of design modifications are possible, which are all within the framework of the invention. Particularly the holder, the cover, and the drive of the mirror 2 can have several solutions. It is important that there be a strict coordination between the drives 3 and 6 and, if applicable, a light and dark sensing device for the light beam 4 via a processor or similar device, into which that pattern is entered which is to be applied onto the components that are to be provided with text, and which processor then correspondingly senses the beam according to the movements thereof via the drives 3 and 6 in such a manner that the desired symbols (characters) are correspondingly reproduced in the desired code, e.g. a 5×7 code.

Thereby, the design for holding the deflection head and/or the light source may be adjusted within the framework of what is known, namely in accordance with the design conditions as well as the deflection range that is considered necessary.

What is claimed is:

1. A device for the controlled, two dimensional deflection of a pulsable light beam emanating from a fixed light source such as a laser by means of an adjustable deflection mirror being journalled in a holding head for guiding the light beam along a meandering path for the purpose of marking specific points on small components, by arranging two drive means aligned one behind the other, the improvement comprising:

one of said drive means being a continuously running motor for tilting said deflection mirror within said holding head between two end positions, about an axis;

the other said drive means being a step motor for stepwise rotation of said holding head containing said deflection mirror about an axis perpendicular to said axis of tilt wherein said step motor's action is dependent upon said deflection mirror reaching a said end position of tilt.

2. The device according to claim 1 wherein said deflection mirror is tilted between two end positions by means of said continuously running motor via an eccentric drive.

* * * * *